United States Patent
Rolandi et al.

(10) Patent No.: US 6,549,473 B2
(45) Date of Patent: Apr. 15, 2003

(54) CIRCUITAL STRUCTURE FOR READING DATA IN A NON-VOLATILE MEMORY DEVICE

(75) Inventors: Paolo Rolandi, Voghera (IT); Massimo Montanaro, Pavia (IT); Giorgio Oddone, Rossigione (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/871,234

(22) Filed: May 30, 2001

(65) Prior Publication Data

US 2002/0015332 A1 Feb. 7, 2002

(30) Foreign Application Priority Data

May 31, 2000 (EP) .............................. 00830393

(51) Int. Cl.⁷ .............................................. G11C 16/04
(52) U.S. Cl. .................. 365/189.07; 365/210; 365/207; 365/200
(58) Field of Search ............................ 365/189.07, 210, 365/207, 189.01, 230.03, 200, 185.09

(56) References Cited

U.S. PATENT DOCUMENTS

| | | | |
|---|---|---|---|
| 5,023,839 A | * 6/1991 | Suzuki et al. | 365/185.09 |
| 5,444,656 A | 8/1995 | Bauer et al. | 365/189.01 |
| 5,629,892 A | 5/1997 | Tang | 365/185.2 |
| 5,748,546 A | 5/1998 | Bauer et al. | 365/210 |
| 5,754,475 A | * 5/1998 | Bill et al. | 365/185.25 |
| 5,774,395 A | 6/1998 | Richart et al. | 365/185.2 |
| 5,905,673 A | 5/1999 | Khan | 365/185.03 |
| 5,936,906 A | * 8/1999 | Tsen | 365/210 |
| 6,236,588 B1 | * 5/2001 | Koo | 365/145 |

FOREIGN PATENT DOCUMENTS

| | | |
|---|---|---|
| EP | 0753859 A1 | 1/1997 |
| EP | 0798727 A1 | 10/1997 |
| EP | 0978844 A1 | 2/2000 |
| JP | 05182470 | 7/1993 |

* cited by examiner

Primary Examiner—David Lam
(74) Attorney, Agent, or Firm—Lisa K. Jorgenson; Robert Iannucci; Seed IP Law Group PLLC

(57) ABSTRACT

A circuit structure for reading data contained in an electrically programmable/erasable integrated non-volatile memory device includes a matrix of memory cells and at least one reference cell for comparison with a memory cell during a reading phase. The reference cell is incorporated in a reference cells sub-matrix which is structurally independent of the matrix of memory cells. Also provided is a conduction path between the matrix and the sub-matrix, which path includes bit lines of the sub-matrix of reference cells extended continuously into the matrix of memory cells.

17 Claims, 2 Drawing Sheets

CIRCUITAL STRUCTURE FOR READING DATA IN A NON-VOLATILE MEMORY DEVICE

TECHNICAL FIELD

The invention broadly relates to an electronic multi-level non-volatile memory device which is monolithically integrated in a semiconductor and incorporates a circuit structure for reading data contained in the memory.

In particular, the invention relates to a circuit structure for producing a current reference in a multi-level non-volatile memory, and the description which follows will cover this field of application just for convenience of explanation.

BACKGROUND OF THE INVENTION

As is well known in this technical field, recent developments in the manufacture of non-volatile memories, specifically memories of the EPROM, EEPROM and FLASH types, point toward an increase of their storage capacity through the use of multi-level architectures, that is, memory matrices whose cells can store multiple logic states.

A preliminary comparative review of the circuit structures of conventional two-level memories may help, to make the aspects of this invention more clearly understood.

Electronic memory devices usually comprise at least one matrix of memory cells laid into rows and columns. Logic information can be written or read into/from each cell by suitably biasing a corresponding one of the rows or the columns.

A typical memory cell includes a field-effect transistor having a control gate terminal, a floating gate region, a source terminal, and a drain terminal. A potential range separates the two possible logic states of a two-level memory cell—e.g., a logic "0" to indicate a programmed cell, and a logic "1" to indicate an erased cell.

In operation, for the purpose of discriminating the informational contents of a two-level non-volatile memory cell, the memory cell is compared with a reference cell which is structurally identical to the memory cell but it doesn't include program circuits.

The operation for selecting a memory cell in order to read its information contents consists in applying a suitable bias voltage to the control gate terminal of the cell. If the memory cell has been preliminarily programmed, then an electric charge is trapped within its floating gate region, and the threshold voltage of the cell is such that its current will be below that of the reference cell.

On the other hand, if the cell has been erased, no charge is trapped within its floating gate region, and the cell state can be identified by unbalanced-load comparison.

Thus, a method most frequently used for reading from a flash type of memory cell consists of comparing the current draw by the cell to be read and the current draw by the reference cell. A simple comparator, known as sense amplifier, is used to perform the comparison and output a corresponding result.

In the instance of a multi-level memory device, no less than $2^n-1$ references are needed to discriminate a cell having an n-bit storage capacity, which references may be voltage- or current-oriented dependent on the reading method applied.

As an example, a prior method of determining the state of an n-level memory cell is described in U.S. Pat. No. 5,748,546, wherein the threshold voltage of a cell to be read is compared with a plurality (n−1) of reference voltages From a structure standpoint, conventional two-level EPROMs have the reference cells and memory cells allocated to the same matrix. However, this solution may not be easily extended to multi-level memories because this would result in the area requirements increasing with the number of bits, and because the reference cells of a multi-level memory must be suitably programmed.

These difficulties are emphasized by the use of different reference cells for reading and programming. In fact, a reference line which included the as many reference cells as are the matrix cells could affect the reference cell read and/or program time to a significant extent.

SUMMARY OF THE INVENTION

An embodiment of this invention provides a circuit structure whereby the cell states of a preferably, but not exclusively, multi-level memory can be determined with only minor impact on the area requirements of the memory device and the reference cell reading speed.

The circuit structure provides, for each matrix block included in a specific read sector, a corresponding array which contains all the reference cells needed for comparison with the selected matrix cells.

Briefly, all the reference cells are placed in a sub-matrix which is associated with the memory cell matrix. Also, interconnecting paths are provided to maintain a true match of the matrix and the sub-matrix without affecting the reading access time.

The features and advantages of a circuit structure according to the invention will be apparent from the following description of an embodiment thereof, given by way of non-limitative example with reference to the accompanying drawings.

DETAILED DESCRIPTION OF THE INVENTION

Figure 1:
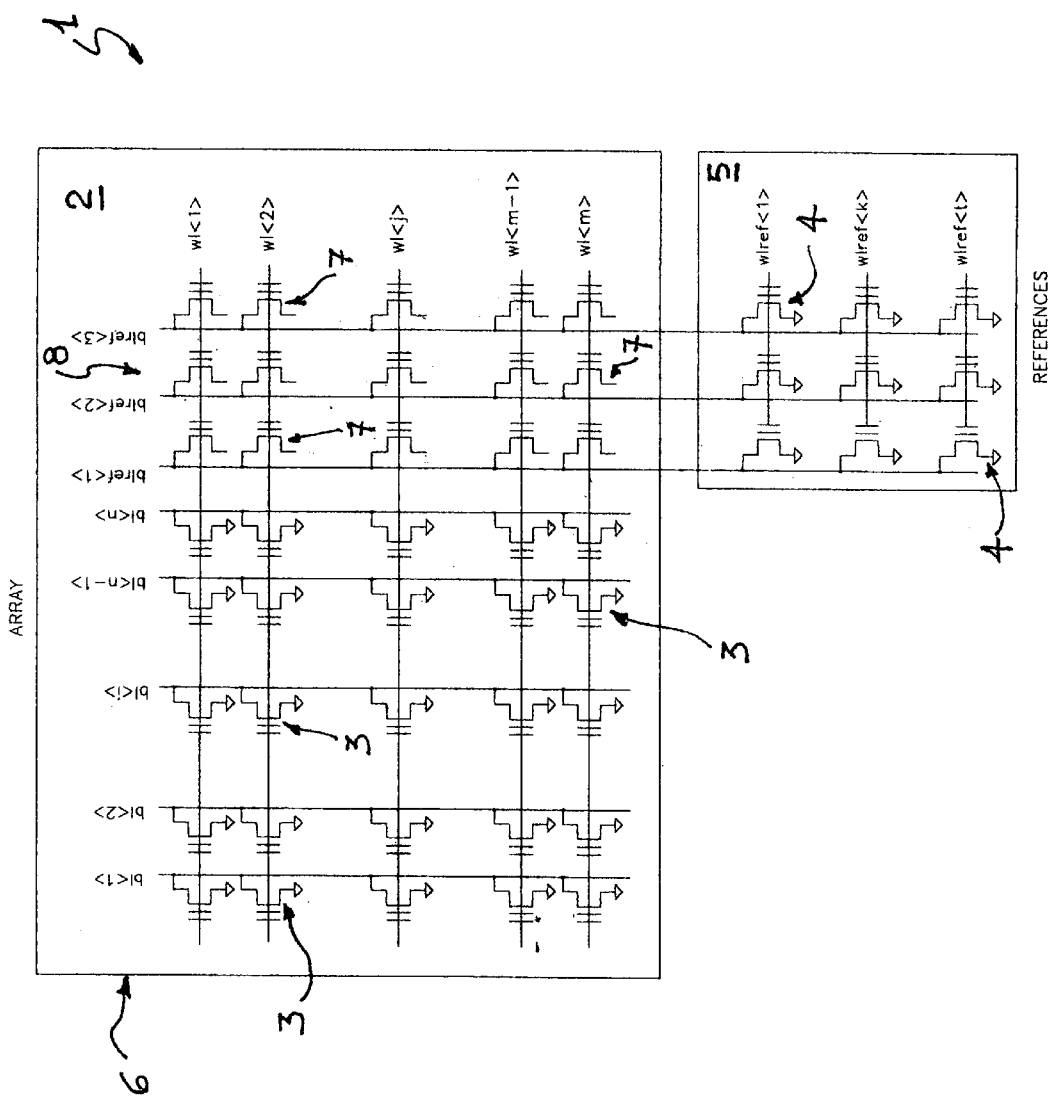
FIG. 1 shows schematically a circuit structure, according to the invention, for an electrically programmable/erasable non-volatile memory device incorporating a matrix of memory cells.

Referring to the drawings, a circuit structure for a non-volatile memory device incorporating a matrix 2 of memory cells 3, according to this invention, is shown generally at 1 in schematic form.

This memory device is integrated monolithically in a semiconductor and is programmable/erasable electrically, it being of the EEPROM or the flash type, for example. Furthermore, this memory device may be of the single or the dual supply type.

The following considerations apply, however, to any other types of EEPROM or flash memories, as well as to EPROMs.

The memory matrix 2 is organized into m rows or word lines wl and n columns or bit lines bl. Each cell 3 comprises essentially a floating-gate transistor having drain and source regions formed in a semiconductor substrate and separated by a channel region. The floating gate is formed on top of the substrate and isolated therefrom by a thin layer of gate oxide. A control gate is coupled capacitively to the floating gate through a dielectric layer. The control gate is the control terminal of the transistor, the drain and source terminals being its conduction terminals.

Figure 2:
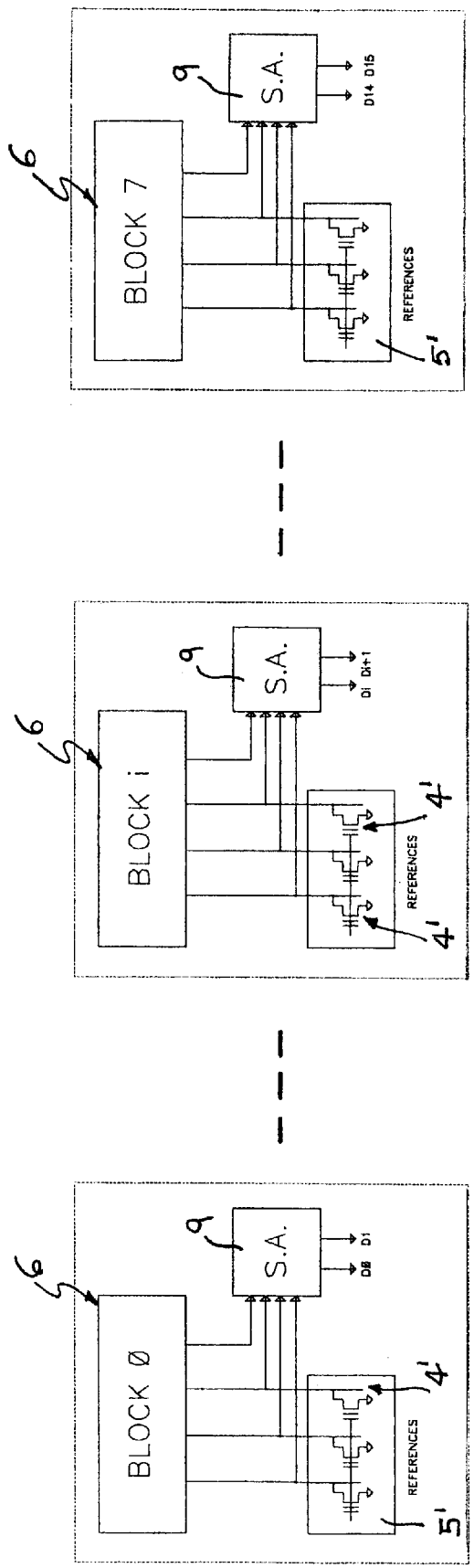
FIG. 2 shows schematically a circuit structure, according to the invention, for a non-volatile memory device incorporating a matrix of multi-level memory cells.

The matrix 2 of memory cells 3 is preferably divided into plural electrically programmable sectors 6 which can be programmed by single bytes. To illustrate the point, in the diagram of FIG. 1, the matrix 2 may be considered either as a whole or as represented by a given sector. In FIG. 2, the matrix sectors 6 are instead designated BLOCK0, . . . , BLOCK7.

Memory cells 3 in the same word line wl share the electric line which drives their respective control gates, whereas memory cells 3 in the same bit line bl share the drain terminals. The source terminals of the memory cells 3 are all connected to a ground reference.

With suitable voltage values being applied to the terminals of a memory cell 3, the state of the latter can be altered by changing the amount of charge in the floating gate. The operation of storing charge into the floating gate is called "programming" and consists of biasing the control gate and drain terminals to a predetermined voltage value which lies above the source terminal potential.

A flash memory may be programmed either by the sector (page mode) or the byte (byte mode). In the page mode, all the cells in the same matrix row are addressed simultaneously. In the byte mode, a single byte is addressed of the byte plurality available in the same row.

To erase a flash memory cell, its source terminal is applied a voltage equal approximately to the program voltage, its drain terminal is held floating, and its control gate is either connected to ground or to a negative voltage reference. Similar as with programming, a cell can be erased by single or multiple sectors.

For reading, the current draw of a memory cell 3 is simply compared with that of a reference cell 4, the latter being usually a virgin cell with the same construction as the matrix 2 cell 3.

The read operation, whereby a cell 3 is selected for the purpose of reading its informational contents, consists of applying a suitable bias voltage to the control gate terminal of the memory cell. If the cell 3 has been preliminarily programmed, then an electric charge is trapped within its floating gate region, and the threshold voltage of the cell is such that its drain current conduction will be below that of the reference cell 4.

On the other hand, if the cell 3 has been erased, no charge is trapped within its floating gate region, and the cell will be conducting a larger drain-source current than the reference cell 4.

Advantageously, the reference cells 4 for comparison with the cells 3 of the matrix 2 during a reading phase are contained in a sub-matrix 5 which is structurally independent of the memory matrix 2.

The sub-matrix 5 of reference cells 4 is similar in construction to the matrix 2 of memory cells 3. Briefly, the reference cells 4 in the same word line wlref will also share the electric line used for driving their respective control gates, and the reference cells 4 in the same bit line blref have their drain terminals in common.

It should be understood that conduction paths are provided for linking the matrix 2 and sub-matrix 5 together.

More particularly, the bit lines blref of the sub-matrix 5 of reference cells 4 are extended continuously into the memory cell matrix 2. These bit lines blref extended into the matrix 2 will be referred to as dummy bit lines.

Suitably, the total capacitive load of the dummy bit lines is effectively compensated by plural cells 7, referred to as dummy cells, being connected to the dummy bit lines blref inside the matrix structure 2.

These dummy cells 7 have their respective source terminals held floating and unconnected to ground, in contrast with the memory cells 3 in the matrix 2.

Thus, selecting any of the wordlines wl of the memory matrix 2 actually would involve no activation of dummy cells 7, the latter being never conducting.

In practice, during a reading phase, a matrix cell 3 to be read and a corresponding dummy cell 7 are selected simultaneously, the dummy cell behaving as if it were fully written. In this way, the combined capacitive weights of the gate and junction capacitances of both the dummy cell 7 and its bit line are taken into account, promoting accurate matching to the matrix cells 3.

However, the reference cells 4 should be regarded as being external of the matrix 2 and associated with respective additional word lines wlref which are always selected.

It is as if the sub-matrix 5 of reference cells 4 were associated with a sub-matrix 8 of disconnected dummy cells 7.

It might occur to the skilled person in the art of adding some redundant reference word lines in order to provide a minimum of redundancy for the reference cells 4 in the event of one of these cells becoming damaged. In fact, a single reference cell 4 would, once damaged, be enough to impair the operability of the whole memory device.

A modified embodiment will now be described with reference to the example shown in FIG. 2 which suits a memory device having multi-level memory cells 3'.

FIG. 2 shows schematically a plurality of matrix sectors 6, each having a corresponding sub-matrix 5' of reference cells 4' associated therewith.

Thus, the sub-matrix 5' of reference cells 4' is duplicated for each read sectors BLOCK0, . . . , BLOCK7.

Each sector 6 can have two or more outputs O0; O1; . . . ; Oi, Oi+1, dependent on the number of bits stored in the basic cell 3'. These outputs are produced, of course, by a read amplifier block or sense amplifier (SA) 9 associated with each sector 6 of the cell matrix.

FIG. 2 illustrates the instance of a multi-level memory device having a two-bit cell 3'. The reference cells 4' are associated with each sector for the purpose of avoiding all kinds of asymmetry along the conduction path that allows the memory cells 3' to be read. In fact, were a single matrix of reference cells 4' be arranged to serve the entire matrix of memory cells 3' by duplication of reference currents or voltages, the reference cell matrix would be unable to provide true duplicates because of unavoidable mismatch of the read operation. With multi-level cells, the read operation should be as accurate as possible.

The circuit structure 1 does solve technical problems of the prior art and offers a number of advantages, foremost among which is that it provides optimum matching of the matrix and the reference cells. And this with a bare minimum of area occupation and circuit complexity.

Furthermore, the reading access time is kept substantially the same for each matrix sector to be read.

It should be understood that changes and modifications may be made unto the circuit structure of this invention by a skilled person in the art within the scope of the following claims.

What is claimed is:

1. A circuit structure for reading data contained in an electrically programmable/erasable integrated non-volatile memory device, comprising:
   a memory matrix of memory cells arranged in rows and columns, the memory cells in each row being connected to a respective word line of a plurality of word lines, and the memory cells in each column being connected to a respective bit line of a plurality of bit lines; and
   a reference matrix of reference cells for comparison with the memory cells of the matrix during a reading phase, wherein said reference matrix is structurally independent of the memory matrix such that none of the word lines of the memory matrix is shared by the reference matrix and none of the bit lines of the memory is shared by the reference matrix.

2. A circuit structure according to claim 1 wherein said sub-matrix is organized into rows or word lines and columns or bit lines, and reference cells in the same row have control gates that are shared with each other, whereas reference cells in the same column have drain terminals in common with each other.

3. A circuit structure according to claim 1 wherein said memory cells and associated reference cells are multi-level cells.

4. A circuit structure of a programmable/erasable integrated non-volatile memory device comprising:
   a matrix of memory cells;
   a reference cell of a reference cell sub-matrix wherein the reference cell is structurally independent of the matrix of memory cells; and
   a conduction path is provided between the matrix of memory cells and the reference cell sub-matrix wherein said path includes bit lines of the reference cell sub-matrix of reference cells, said bit lines being extended continuously into the matrix of memory cells.

5. A circuit structure according to claim 4 further comprising a plurality of dummy cells connected to said bit lines of the sub-matrix within the matrix of memory cells.

6. A circuit structure according to claim 5 wherein said dummy cells have source terminals that are held floating.

7. A circuit structure of a programmable/erasable integrated non-volatile memory device comprising:
   a matrix of memory cells;
   a reference cell of a reference cell sub-matrix wherein the reference cell is structurally independent of the matrix of memory cells; and
   the matrix of memory cells comprises a plurality of matrix sectors and a plurality of corresponding sub-matrices of reference cell, a corresponding sub-matrix of reference cells of the plurality of sub-matrices being associated with each of said matrix sectors, respectively.

8. A circuit structure according to claim 7 wherein a conduction path is provided between one of the sectors of the matrix and the corresponding sub-matrix, and said path includes bit lines of the corresponding sub-matrix, said bit lines being extended continuously into the sector of the matrix of memory cells.

9. An electrically programmable/erasable integrated non-volatile memory device, comprising:
   a matrix of memory cells; and
   a matrix of reference cells for comparing to the memory cells when the memory cells are being read, wherein the reference cell matrix includes bit lines of the reference cells, the bit lines extending continuously into the memory cell matrix to provide a conductive path between the matrices and wherein the reference cell matrix is organized into rows of memory cells connected by word lines and further includes a row of redundancy memory cells that is used to replace a defective one of the rows of memory cells.

10. The memory device of claim 9 wherein the memory cells and reference cells are multi-level cells.

11. A electrically programmable/erasable integrated non-volatile memory device comprising:
   a matrix of memory cells;
   a matrix of reference cells for comparing to the memory cells when the memory cells are being read, wherein the reference cell matrix includes bit lines of the reference cells, the bit lines extending continuously into the memory cell matrix to provide a conductive path between the matrices; and
   the memory cell matrix includes a sub-matrix of memory cells to be read and a sub-matrix of dummy cells that share word lines with the sub-matrix of memory cells and share the bit lines of the reference cell matrix.

12. The memory device of claim 11 wherein the dummy cells have source terminals that are held floating.

13. An electrically programmable/erasable integrated non-volatile memory device, comprising:
   a matrix of memory cells including a memory cell sub-matrix of memory cells to be read and a dummy cell sub-matrix of dummy cells coupled to the memory cells of the memory cell sub-matrix; and
   a reference cell matrix of reference cells for comparing to the memory cells of the memory cell sub-matrix when the memory cells are being read, wherein the reference cells of the reference cell matrix are connected to the dummy cells of the dummy cell sub-matrix to provide a conductive path between a group of the dummy cells and a group of the reference cells when one of the reference cells in the group of reference cells is selected for comparison to one of the memory cells to be read.

14. The memory device of claim 13 where in the reference cell matrix is organized into rows of memory cells connected by word lines and further includes a row of redundancy memory cells that is used to replace a defective one of the rows of memory cells.

15. The memory device of claim 13 wherein the reference cell matrix includes a bit line that connects a plurality of the reference cells to a plurality of the dummy cells of the dummy cell sub-matrix.

16. The memory device of claim 13 wherein the dummy cells have source terminals that are held floating.

17. The memory device of claim 13 wherein the memory cells and reference cells are multi-level cells.

* * * * *